(12) United States Patent
Dosho et al.

(10) Patent No.: US 8,981,978 B2
(45) Date of Patent: Mar. 17, 2015

(54) RESONATOR AND OVERSAMPLING A/D CONVERTER

(71) Applicant: Panasonic Corporation, Osaka (JP)

(72) Inventors: Shiro Dosho, Osaka (JP); Kazuo Matsukawa, Osaka (JP); Yosuke Mitani, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/072,743

(22) Filed: Nov. 5, 2013

(65) Prior Publication Data

US 2014/0055294 A1    Feb. 27, 2014

Related U.S. Application Data

(63) Continuation of application No. 13/073,335, filed on Mar. 28, 2011, now Pat. No. 8,604,956, which is a continuation of application No. PCT/JP2009/001415, filed on Mar. 27, 2009.

(30) Foreign Application Priority Data

Sep. 30, 2008  (JP) ................ 2008-255272

(51) Int. Cl.
*H03M 3/00* (2006.01)
*H03H 11/12* (2006.01)

(52) U.S. Cl.
CPC .......... *H03M 3/454* (2013.01); *H03H 11/1252* (2013.01); *H03M 3/404* (2013.01); *H03M 3/438* (2013.01)
USPC .......................... 341/143; 327/554

(58) Field of Classification Search
USPC ......................... 341/143, 144, 145; 327/554
See application file for complete search history.

(56) References Cited

U.S. PATENT DOCUMENTS

| | | | |
|---|---|---|---|
| 3,979,670 | A | 9/1976 | Vahaviolos |
| 4,001,710 | A | 1/1977 | Darrow |
| 4,002,858 | A | 1/1977 | Giese |

(Continued)

FOREIGN PATENT DOCUMENTS

| | | |
|---|---|---|
| JP | 53-88549 A | 8/1978 |
| JP | 58-500926 A | 6/1983 |

(Continued)

OTHER PUBLICATIONS

Notice of Allowance issued in U.S. Appl. No. 13/073,335 with Date Mailed Aug. 15, 2013.

(Continued)

*Primary Examiner* — Brian Young
(74) *Attorney, Agent, or Firm* — McDermott Will & Emery LLP (57) ABSTRACT

Two resistive elements and a capacitive element are coupled between a first node and each of an inverting input terminal of an operational amplifier, an output terminal of the operational amplifier, and a common node. A resistive element and a capacitive element are coupled between the first node and a signal input terminal. Two capacitive elements and a resistive element are coupled between a second node and each of the inverting input terminal, the output terminal, and the common node. Two capacitive elements are coupled between the second node and each of the signal input terminal, and the common node.

16 Claims, 8 Drawing Sheets

(56) References Cited

U.S. PATENT DOCUMENTS

| | | | |
|---|---|---|---|
| 4,509,037 A | 4/1985 | Harris | |
| 4,553,103 A | 11/1985 | Rollett | |
| 6,369,645 B1 | 4/2002 | Takahashi | |
| 7,439,891 B2 * | 10/2008 | Kozak et al. | 341/143 |
| 7,902,916 B2 * | 3/2011 | Jeong | 327/554 |
| 7,928,877 B1 * | 4/2011 | Kaplan | 341/143 |

FOREIGN PATENT DOCUMENTS

| | | |
|---|---|---|
| JP | 58-129821 | 8/1983 |
| JP | 62-183209 A | 8/1987 |
| JP | 01-094726 | 4/1989 |
| JP | 03-216559 A | 9/1991 |
| JP | 2002-185329 A | 6/2002 |
| JP | 2001-168721 A | 6/2011 |

OTHER PUBLICATIONS

International Search Report issued in International Application No. PCT/JP2009/001415 with Date of mailing Jun. 23, 2009.

* cited by examiner

RESONATOR AND OVERSAMPLING A/D CONVERTER

CROSS-REFERENCE TO RELATED APPLICATION

This is a continuation of U.S. patent application Ser. No. 13/073,335, filed on Mar. 28, 2011, which is a continuation of PCT International Application PCT/JP2009/001415 filed on Mar. 27, 2009, which claims priority to Japanese Patent Application No. 2008-255272 filed on Sep. 30, 2008. The disclosures of these applications including the specifications, the drawings, and the claims are hereby incorporated by reference in their entirety.

BACKGROUND

The present disclosure relates to resonators, and more particularly to resonators suitable for continuous-time oversampling $\Delta\Sigma$ converters.

Oversampling A/D converters are widely used for front ends of communication devices and conversion of audio signals, and are essential circuit techniques for present communication, video, and audio signal processing circuits. As a type of oversampling A/D converters, there are continuous-time delta sigma A/D converters (CTDS-ADCs) including continuous-time filters such as integrators and resonators.

In a conventional CTDS-ADC, an input signal passes through a number n of cascade-coupled continuous-time filters, and is quantized by a quantizer. A digital output of the quantizer is converted to analog current signals by a number n of D/A converters, and then fed back to the respective number n of continuous-time filters. Since CTDS-ADCs do not include any switch in an analog circuit, voltages can be lowered. Moreover, CTDS-ADCs do not require any prefilter which is usually needed when using a sampling filter. In these respects, CTDS-ADCs are suited for application of communication systems, and the application has been increasingly researched and developed in recent years.

Figure 9:
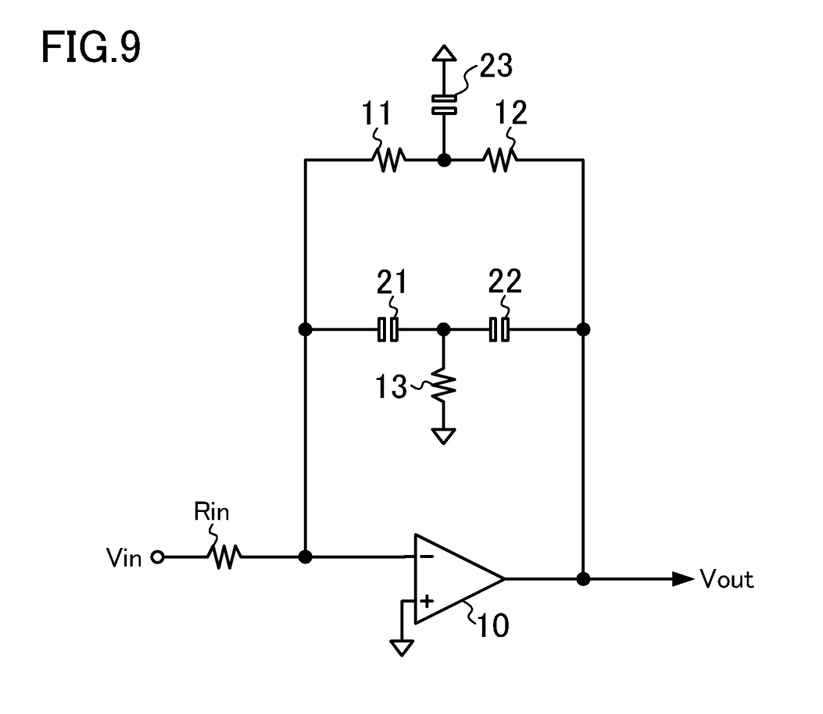
FIG. 9 is a configuration diagram of a conventional resonator.

In order to improve resolution performance and SN characteristics of CTDS-ADCs, the order of a quantization noise transfer function needs to be increased. However, numbers of operational amplifiers are needed to achieve high-order transfer characteristics, thereby causing disadvantages in a circuit size and power consumption. Thus, realization of high-order transfer characteristics with a few operational amplifiers is required. As an example, there is a resonator as shown in FIG. 9, which achieves second-order transfer characteristics with a single operational amplifier. This resonator includes a twin T notch filter between an output terminal and an inverting input terminal of an operational amplifier 10. A signal Vin is input to the inverting input terminal of the operational amplifier 10 via a resistive element Rin, and a signal Vout is output from the output terminal of the operational amplifier 10. The twin T notch filter includes a first T filter having resistive elements 11 and 12, and a capacitive element 23, and a second T filter having capacitive elements 21 and 22, and a resistive element 13 (see, e.g., Japanese Patent Publication No. H03-216559). Since a signal is not fed back from the output terminal to a non-inverting input terminal of the operational amplifier 10 at a resonance frequency of the twin T notch filter, a feedback loop of the operational amplifier 10 is substantially open, thereby obtaining extremely high gain. On the other hand, although it is not a resonator, a second-order filter is known, in which a signal is input not to an inverting input terminal of an operational amplifier but to an intermediate node between a first and second T filters (see, e.g., U.S. Pat. No. 4,553,103).

In the above-mentioned second-order resonator, where resistance values of the resistive elements 11-13 are $R_1$, $R_2$, and $R_3$, and capacitance values of the capacitive elements 21-23 are $C_1$, $C_2$, and $C_3$, respectively, the resonance condition is represented as follows.

$1/R_3 = 1/R_1 + 1/R_2$ and $C_3 = C_1 + C_2$

A transfer function is represented by the following equation. Note that s is the Laplace operator.

$$\frac{Vout}{Vin} = -\frac{\left(\frac{1}{C_1} + \frac{1}{C_2}\right)^{-1} s + \frac{\frac{1}{R_1} + \frac{1}{R_2}}{C_1 C_2}}{s^2 + \frac{Rin}{R_1 R_2 C_1 C_2}} \quad \text{Equation 1}$$

In the transfer function, the capacitance value $C_1$ and the capacitance value $C_2$ are included in all of the first-order and zeroth-order coefficients of the numerator, and the zeroth-order coefficient of the denominator. Thus, when at least one of the capacitance value $C_1$ and the capacitance value $C_2$ is changed to change the first-order term of s, the pole frequency and the zeroth-order term of s change at the same time. As such, in a conventional second-order resonator, coefficients of the transfer function are associated with each other, and thus, great design efforts are needed to realize desired transfer characteristics. It is also difficult to dynamically change the transfer characteristics to desired values in accordance with the type of application.

SUMMARY

The present disclosure may be advantageous in easily setting and changing transfer characteristics of a second-order resonator with a single operational amplifier.

First, a resonator according to an aspect of the present disclosure includes an operational amplifier coupled to a common node at a non-inverting input terminal; a first resistive element coupled between a first node and an inverting input terminal of the operational amplifier; a second resistive element coupled between the first node and an output terminal of the operational amplifier; a first capacitive element coupled between a second node and the inverting input terminal of the operational amplifier; a second capacitive element coupled between the second node and the output terminal of the operational amplifier; a third capacitive element coupled between the first node and the common node; a third resistive element coupled between the second node and the common node; a fourth resistive element coupled between the first node and a signal input terminal; a fourth capacitive element coupled between the second node and the signal input terminal; a fifth capacitive element coupled between the first node and the signal input terminal; and a sixth capacitive element coupled between the second node and the common node. A sum of inverse numbers of resistance values of the first, second and fourth resistive elements is preferably equal to an inverse number of a resistance value of the third resistive element. A sum of capacitance values of the third and fifth capacitive elements is preferably equal to a sum of capacitance values of the first, second, fourth and sixth capacitive elements. With this configuration, coefficients of the transfer function can be independently changed. Therefore, transfer characteristics of the resonator can be easily set and changed.

Resistance values of the second and fourth resistive elements, and capacitance values of the fourth and fifth capacitive elements may be variable. Specifically, the second and fourth resistive elements may include a plurality of resistive elements coupled in parallel, each of which is coupled to the first node at a first end, and selectively coupled to either one of a signal path or the common node at a second end. The fourth capacitive element may include a plurality of capacitive elements coupled in parallel, each of which is coupled to the second node at a first end, and selectively coupled to either one of a signal path or the common node at a second end. The fifth capacitive element may include a plurality of capacitive elements coupled in parallel, each of which is coupled to the first node at a first end, and selectively coupled to either one of a signal path or the common node at a second end. This configuration dynamically changes the transfer function while satisfying the resonance condition.

The resonator may further include a fifth resistive element coupled between the first node and a second signal input terminal, and having a resistance value of $1/\alpha$ of that of the second resistive element; and a seventh capacitive element coupled between the second node and the second signal input terminal, and having a capacitance value a times of that of the second capacitive element. With this configuration, two input signals can be summed without providing any adder.

Resistance values of the second, fourth, and fifth resistive elements, and capacitance values of the fourth and fifth capacitive elements may be variable. Specifically, the second, fourth, and fifth resistive elements may include a plurality of resistive elements coupled in parallel, each of which is coupled to the first node at a first end, and selectively coupled to either one of a signal path or the common node at a second end. The fourth capacitive element may include a plurality of capacitive elements coupled in parallel, each of which is coupled to the second node at a first end, and selectively coupled to either one of a signal path or the common node at a second end. The fifth capacitive element may include a plurality of capacitive elements coupled in parallel, each of which is coupled to the first node at a first end, and selectively coupled to either one of a signal path or the common node at a second end. With this configuration, two input signals can be summed, and in addition, the transfer function can be dynamically changed while satisfying the resonance condition.

On the other hand, a resonator according to another aspect of the present disclosure includes an operational amplifier coupled to a common node at a non-inverting input terminal; a first resistive element coupled between a first node and an inverting input terminal of the operational amplifier; a second resistive element coupled between the first node and an output terminal of the operational amplifier; a first capacitive element coupled between a second node and the inverting input terminal of the operational amplifier; a second capacitive element coupled between the second node and the output terminal of the operational amplifier; a third capacitive element coupled between the first node and the common node; a third resistive element coupled between the second node and the common node; a fourth resistive element coupled between the first node and a signal input terminal; a fourth capacitive element coupled between the second node and the signal input terminal; a fifth resistive element coupled between the second node and the signal input terminal; and a sixth resistive element coupled between the first node and the common node. A sum of inverse numbers of resistance values of the first, second, fourth, and sixth resistive elements is preferably equal to a sum of inverse numbers of resistance values of the third and fifth resistive elements. A capacitance value of the third capacitive element is preferably equal to a sum of capacitance values of the first, second and fourth capacitive elements. With this configuration, coefficients of the transfer function can be independently changed. Therefore, transfer characteristics of the resonator can be easily set and changed.

Resistance values of the second, fourth, and fifth resistive elements, and a capacitance value of the fourth capacitive element may be variable. Specifically, the second and fourth resistive elements may include a plurality of resistive elements coupled in parallel, each of which is coupled to the first node at a first end, and selectively coupled to either one of a signal path or the common node at a second end. The fifth resistive element may include a plurality of resistive elements coupled in parallel, each of which is coupled to the second node at a first end, and selectively coupled to either one of a signal path or the common node at a second end. The fourth capacitive element may include a plurality of capacitive elements coupled in parallel, each of which is coupled to the second node at a first end, and selectively coupled to either one of a signal path or the common node at a second end. This configuration dynamically changes the transfer function while satisfying the resonance condition.

The resonator may further include a seventh resistive element coupled between the first node and a second signal input terminal, and having a resistance value of $1/\alpha$ of that of the second resistive element; and a fifth capacitive element coupled between the second node and the second signal input terminal, and having a capacitance value a times of that of the second capacitive element. With this configuration, two input signals can be summed without providing any adder.

Resistance values of the second, fourth, fifth and seventh resistive elements, and a capacitance value of the fourth capacitive element may be variable. Specifically, the second, fourth, and seventh resistive elements may include a plurality of resistive elements coupled in parallel, each of which is coupled to the first node at a first end, and selectively coupled to either one of a signal path or the common node at a second end. The fifth resistive element may include a plurality of resistive elements coupled in parallel, each of which is coupled to the second node at a first end, and selectively coupled to either one of a signal path or the common node at a second end. The fourth capacitive element may include a plurality of capacitive elements coupled in parallel, each of which is coupled to the second node at a first end, and selectively coupled to either one of a signal path or the common node at a second end. With this configuration, two input signals can be summed, and in addition, the transfer function can be dynamically changed while satisfying the resonance condition.

DETAILED DESCRIPTION

Embodiment of the present disclosure will be described hereinafter with reference to the drawings.

First Embodiment

Figure 1:
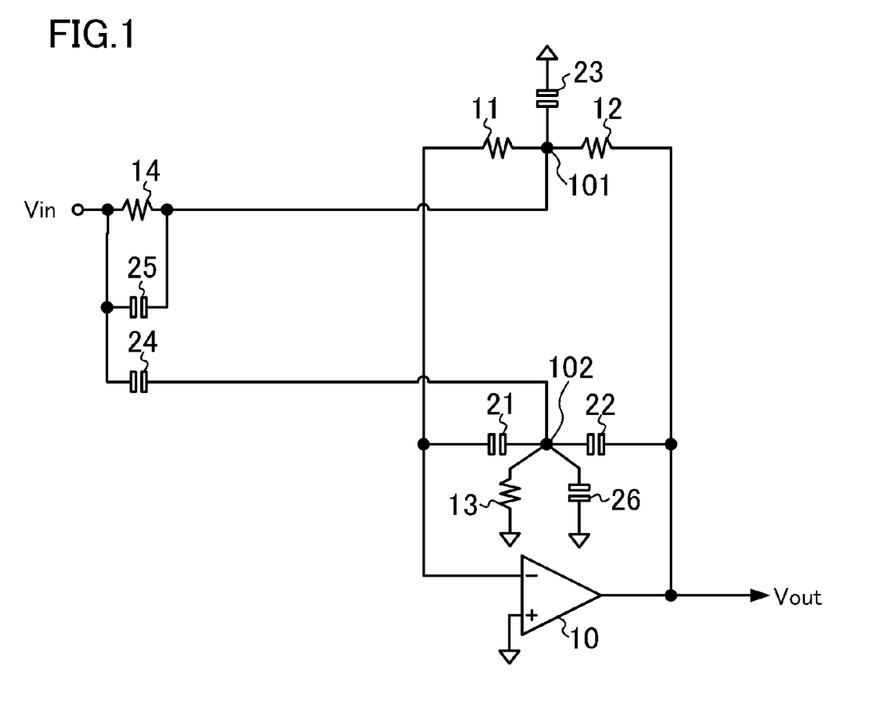
FIG. 1 is a configuration diagram of a resonator according to a first embodiment of the present disclosure.

FIG. 1 illustrates a configuration of a resonator according to a first embodiment. In the resonator according to this embodiment, an operational amplifier 10 is coupled to a common node at a non-inverting input terminal, and a twin T notch filter is inserted between an output terminal and an inverting input terminal. An output of the operational amplifier 10 is an output signal Vout of the resonator. A first T filter includes a resistive element 11, a resistive element 12, and the capacitive element 23. A second T filter includes a capacitive element 21, a capacitive element 22, and a resistive element 13. A signal Vin is input to an intermediate node 101 in the first T filter via a resistive element 14 and a capacitive element 25 which are coupled in parallel. The signal Vin is input to an intermediate node 102 in the second T filter via a capacitive element 24. The intermediate node 102 is coupled to a capacitive element 26 which is coupled to the common node at a first end.

In this embodiment, where resistance values of the resistive elements 11-14 are $R_1, R_2, R_3$, and $R_4$, and capacitance values of the capacitive elements 21-26 are $C_1, C_2, C_3, C_4, C_5$, and $C_6$, respectively, the resonance condition is represented as follows.

$$1/R_1 + 1/R_2 + 1/R_4 = 1/R_3, \text{ and } C_3 + C_5 = C_1 + C_2 + C_4 + C_6$$

That is, the resonance condition is that an overall admittance where elements coupled to the intermediate node 101 are coupled in parallel is equal to an overall admittance where elements coupled to the intermediate node 102 are coupled in parallel. Where capacitance values of the capacitive element 25 and the capacitive element 26 are equal, the transfer function is represented by the following equation.

$$\frac{Vout}{Vin} = -\frac{\frac{C_4}{C_2}s^2 + \frac{C_5}{R_1 C_1 C_2}s + \frac{1}{R_4 R_1 C_1 C_2}}{s^2 + \frac{1}{R_1 R_2 C_1 C_2}} \quad \text{Equation 2}$$

In the transfer function, the resistance value $R_2$ is included only in the zeroth-order coefficient of the denominator, the capacitance value $C_4$ included only in the second-order coefficient of the numerator, the capacitance value $C_5$ is included only in the first-order coefficient of the numerator, and the resistance value $R_4$ is included only in the zeroth-order coefficient of the numerator. This means that the four coefficients can be changed independently by changing the element values. That is, according to the resonator of this embodiment, the pole frequency can be set to any value by controlling the resistance value $R_2$. Moreover, any second-order expression can be made by controlling the capacitance value $C_4$, the capacitance value $C_5$, and the resistance value $R_4$.

When only the above four element values are changed to dynamically change the transfer function, the resonance condition may be damaged. Thus, in order to dynamically change the transfer function while satisfying the resonance condition, the resistive element 12, the resistive element 14, the capacitive element 24, and the capacitive element 25 are preferably configured as follows.

Figure 2:
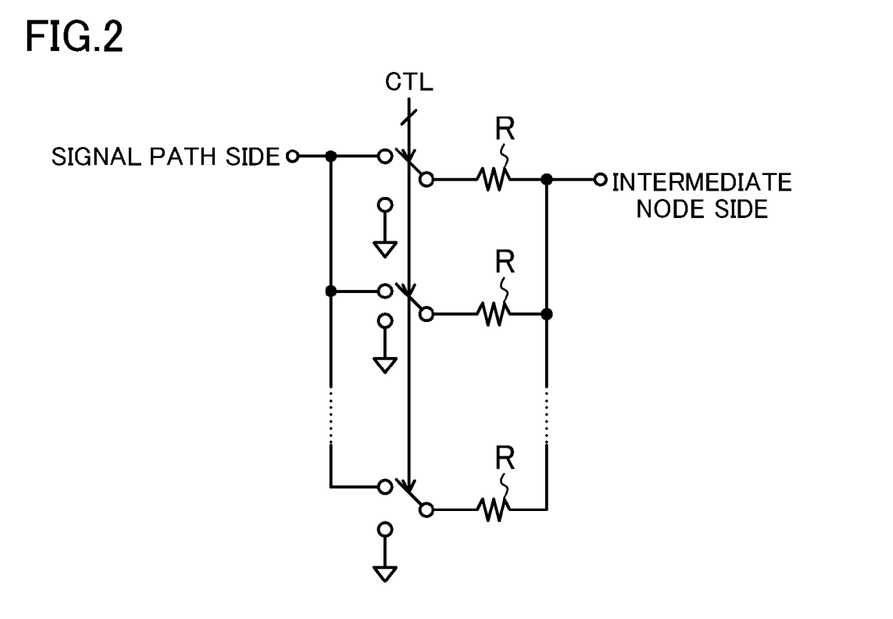
FIG. 2 is a configuration diagram of a variable resistor.

FIG. 2 illustrates an example configuration of the resistive element 12 and the resistive element 14 having a variable resistance value. A resistive element R is coupled to an intermediate node (the intermediate node 101 both in the resistive element 12 and the resistive element 14) at a first end, and selectively coupled to either one of a signal path (the output terminal of the operational amplifier 10 in the resistive element 12, and an input terminal of the signal Vin in the resistive element 14) or the common node at a second end. Such resistive elements R are coupled in parallel. The number of the resistive elements R coupled in parallel is controlled with a control signal CTL, thereby changing the resistance value $R_2$ and the resistance value $R_4$.

Figure 3:
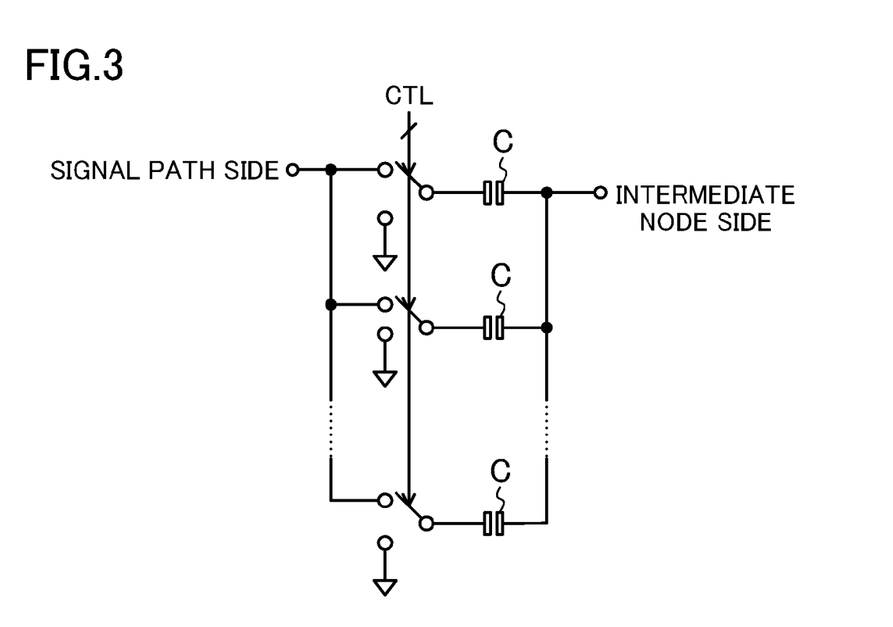
FIG. 3 is a configuration diagram of a variable capacitor.

FIG. 3 illustrates an example configuration of the capacitive elements 24 and 25 having a variable capacitance value. A capacitive element C is coupled to an intermediate node (the intermediate node 102 in the capacitive element 24, and the intermediate node 101 in the capacitive element 25) at a first end, and selectively coupled to either one of a signal path (the input terminal of the signal Vin both in the capacitive element 24 and the capacitive element 25) or the common node at a second end. Such capacitive elements C are coupled in parallel. The number of the capacitive elements C coupled in parallel is controlled with the control signal CTL, thereby changing the capacitance value $C_4$ and the capacitance value $C_5$.

In this embodiment, regardless of whether the resistive element R and the capacitive element C are coupled to the signal path or the common node, the overall admittance where the elements coupled to the intermediate node 101 are coupled in parallel is equal to the overall admittance where the elements coupled to the intermediate node 102 are coupled in parallel. That is, the resonance condition is maintained regardless of whether the resistance value $R_2$, the resistance value $R_4$, the capacitance value $C_4$, and the capacitance value $C_5$ are changed. Therefore, the transfer function can be dynamically changed while satisfying the resonance condition.

With use of the resonator according to this embodiment, a CTDS-ADC having high-order transfer characteristics can be realized with a small number of operational amplifiers. For example, a CTDS-ADC having fifth-order integral characteristics requires a continuous-time filter having transfer characteristics F(s) represented by the following equation. Such a continuous-time filter can be provided by cascade-coupling a single first-order integrator and two of the resonators of FIG. 1.

$$F(s) = \frac{\alpha}{s} \times \frac{a_2 s^2 + a_1 s + a_0}{s^2 + p_1} \times \frac{b_2 s^2 + b_1 s + b_0}{s^2 + p_2} \quad \text{Equation 3}$$

Figure 4:
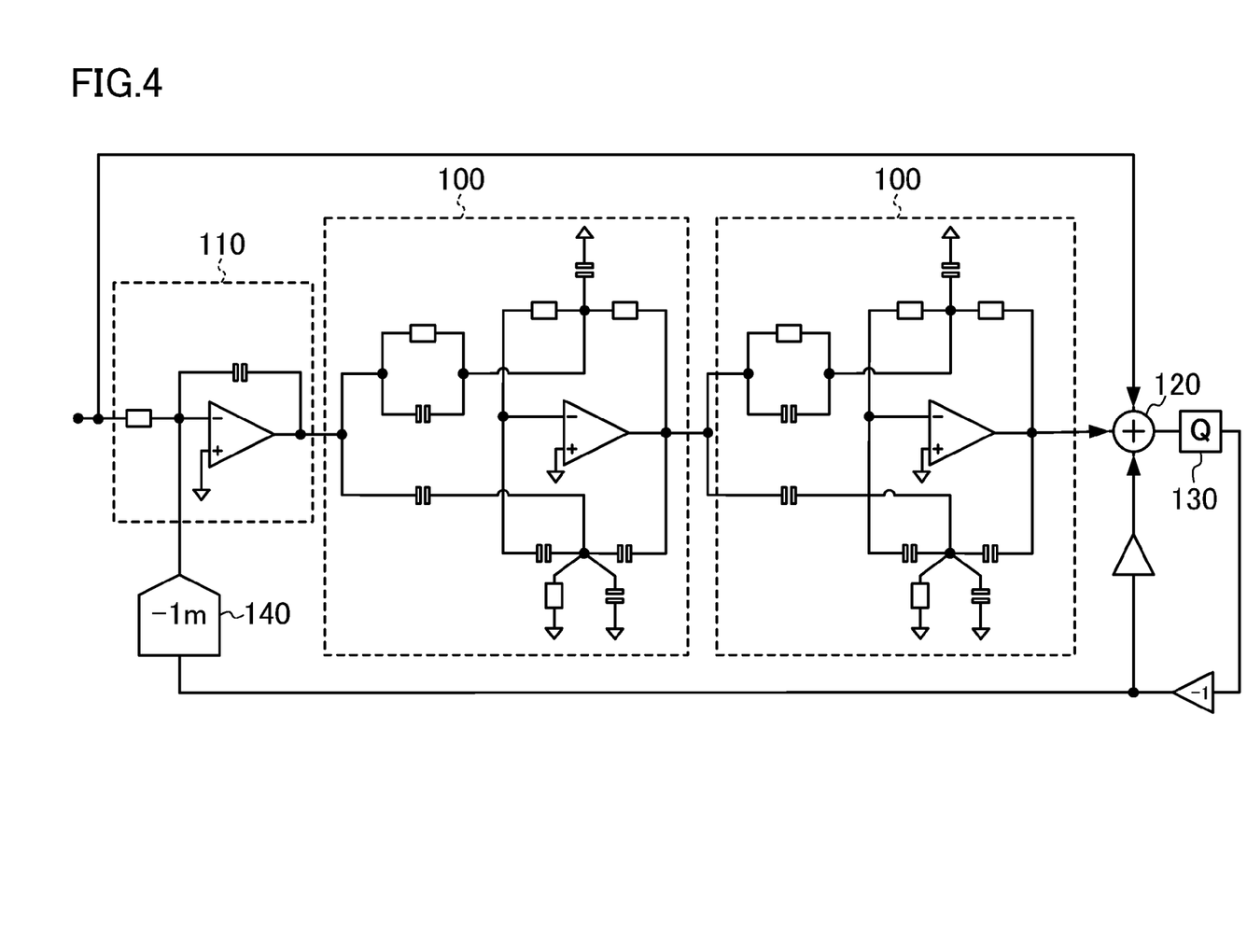
FIG. 4 is a configuration diagram of an oversampling A/D converter using the resonator of FIG. 1.

FIG. 4 illustrates a configuration of a CTDS-ADC using the resonator according to this embodiment. In FIG. 4, the reference character 100 represents the resonator according to this embodiment, the reference character 110 represents a first-order integrator, the reference character 120 represents an adder, the reference character 130 represents a quantizer, and the reference character 140 represents a D/A converter (voltage-current converter).

Note that, in the CTDS-ADC of FIG. 4, an input signal is fed forward to an input of the quantizer 130. This aims to allow only quantization noise to pass through the continuous-time filter, thereby mitigating linear characteristics and a dynamic range required for the continuous-time filter. The detail is described in Japanese Patent Publication No. S63-

39216. Note that the input signal may not be fed forward to the input of the quantizer 130.

Second Embodiment

Figure 5:
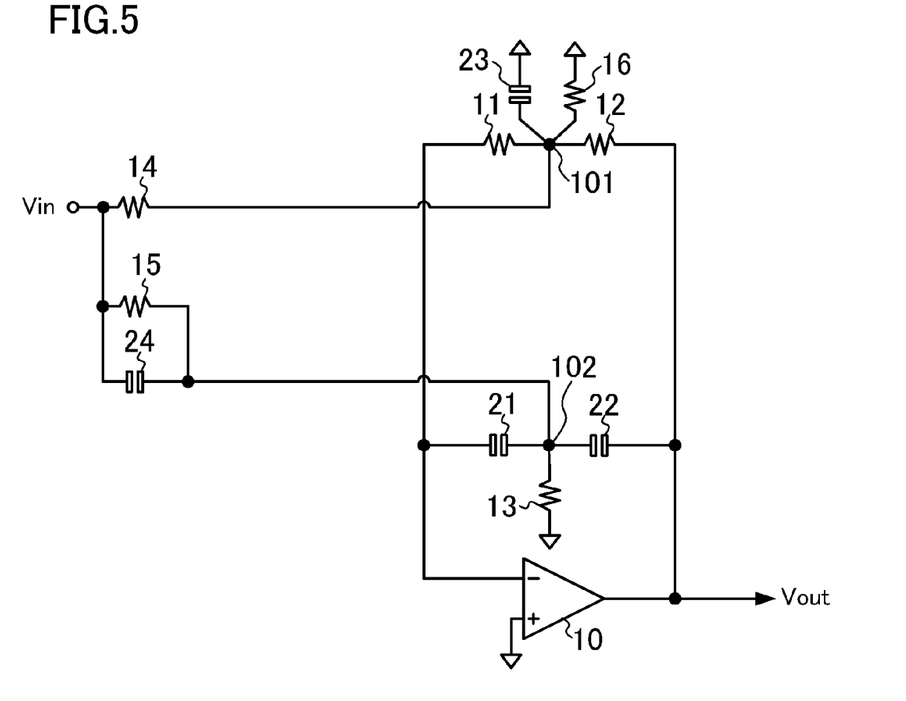
FIG. 5 is a configuration diagram of a resonator according to a second embodiment of the present disclosure.

FIG. 5 illustrates a configuration of a resonator according to a second embodiment. In the resonator according to this embodiment, an operational amplifier 10 is coupled to a common node at a non-inverting input terminal, and a twin T notch filter is inserted between an output terminal and an inverting input terminal. An output of the operational amplifier 10 is an output signal Vout of the resonator. A first T filter includes a resistive element 11, a resistive element 12, and a capacitive element 23. A second T filter includes a capacitive element 21, a capacitive element 22, and a resistive element 13. A signal Vin is input to an intermediate node 101 in the first T filter via a resistive element 14. The signal Vin is input to an intermediate node 102 in the second T filter via a resistive element 15 and a capacitive element 24 which are coupled in parallel. The intermediate node 101 is coupled to a resistive element 16 which is coupled to the common node at a first end.

In this embodiment, where resistance values of the resistive elements 11-16 are $R_1$, $R_2$, $R_3$, $R_4$, $R_5$, and $R_6$, and capacitance values of the capacitive elements 21-24 are $C_1$, $C_2$, $C_3$, and $C_4$, respectively, the resonance condition is represented as follows.

$$1/R_1+1/R_2+1/R_4+1/R_6=1/R_3+1/R_5, \text{ and } C_3=C_1+C_2+C_4$$

Where the resistance values of the resistive element 15 and the resistive element 16 are equal, the transfer function is represented by the following equation.

$$\frac{Vout}{Vin} = -\frac{\frac{C_4}{C_2}s^2 + \frac{1}{R_5 C_2}s + \frac{1}{R_4 R_1 C_1 C_2}}{s^2 + \frac{1}{R_1 R_2 C_1 C_2}} \quad \text{Equation 4}$$

Therefore, also according to the resonator of this embodiment, the pole frequency can be set to any value by controlling the resistance value $R_2$. Moreover, any second-order expression can be made by controlling the capacitance value $C_4$, the capacitance value $C_5$, and the resistance value $R_4$.

Note that, in order to dynamically change the transfer function while satisfying the resonance condition, the resistive element 12, the resistive element 14, the resistive element 15, and the capacitive element 24 may be the variable resistor shown in FIG. 2 or the variable capacitor shown in FIG. 3 as appropriate. Although not shown in the drawings, a CTDS-ADC similar to that in FIG. 4 can be formed with the resonator according to this embodiment.

Third Embodiment

Figure 6:
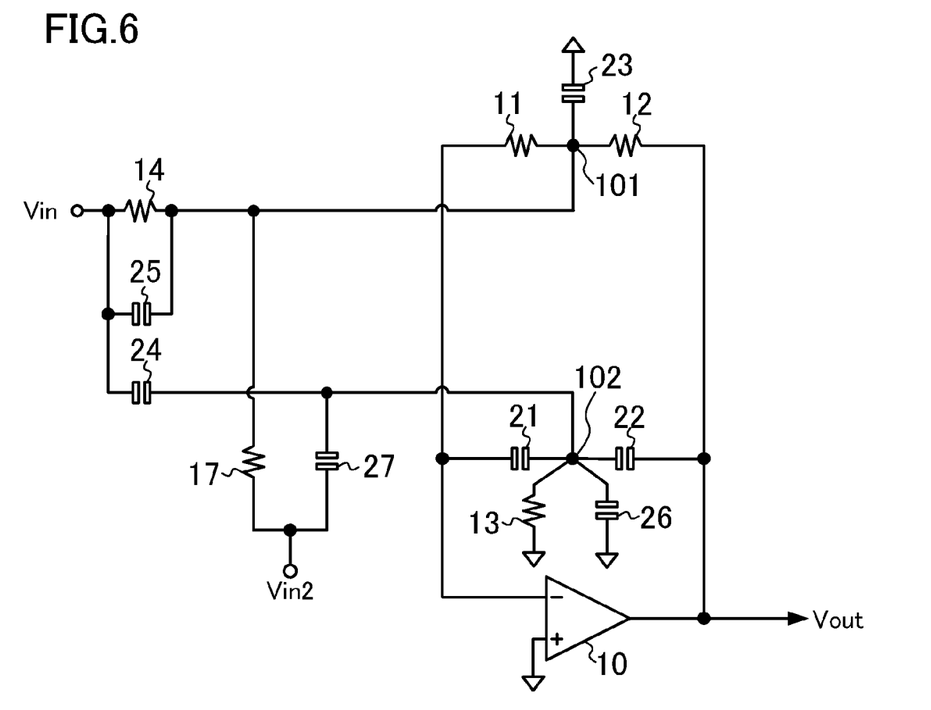
FIG. 6 is a configuration diagram of a resonator according to a third embodiment of the present disclosure.

FIG. 6 illustrates a configuration of a resonator according to a third embodiment. The resonator according to this embodiment includes a resistive element 17 and a capacitive element 27 in addition to the resonator according to the first embodiment (see FIG. 1). The resistive element 17 is coupled between the intermediate node 101 and an input terminal of a signal Vin2. The capacitive element 27 is coupled between the intermediate node 102 and the input terminal of the signal Vin2.

In this embodiment, where a resistance value of the resistive element 17 is $R_2/\alpha$, and a capacitance value of the capacitive element 27 is $\alpha C_2$, the resonance condition is represented as follows.

$$1/R_1+(1+\alpha)/R_2+1/R_4=1/R_3, \text{ and } C_3+C_5=C_1+(1+\alpha)C_2+C_4+C_6$$

Where the capacitance values of the capacitive element 25 and the capacitive element 26 are equal, the transfer function is represented by the following equation. It is found from the transfer function that the signal Vin and the signal Vin2 are summed $$Vout = -\frac{\frac{C_4}{C_2}s^2 + \frac{C_5}{R_1 C_1 C_2}s + \frac{1}{R_4 R_1 C_1 C_2}}{s^2 + \frac{1}{R_1 R_2 C_1 C_2}} Vin - \alpha Vin2 \quad \text{Equation 5}$$

In order to dynamically change the transfer function while satisfying the resonance condition, the resistive element 12, the resistive element 14, the resistive element 17, the capacitive element 24, and the capacitive element 25 may be the variable resistor shown in FIG. 2 or the variable capacitor shown in FIG. 3 as appropriate.

Figure 7:
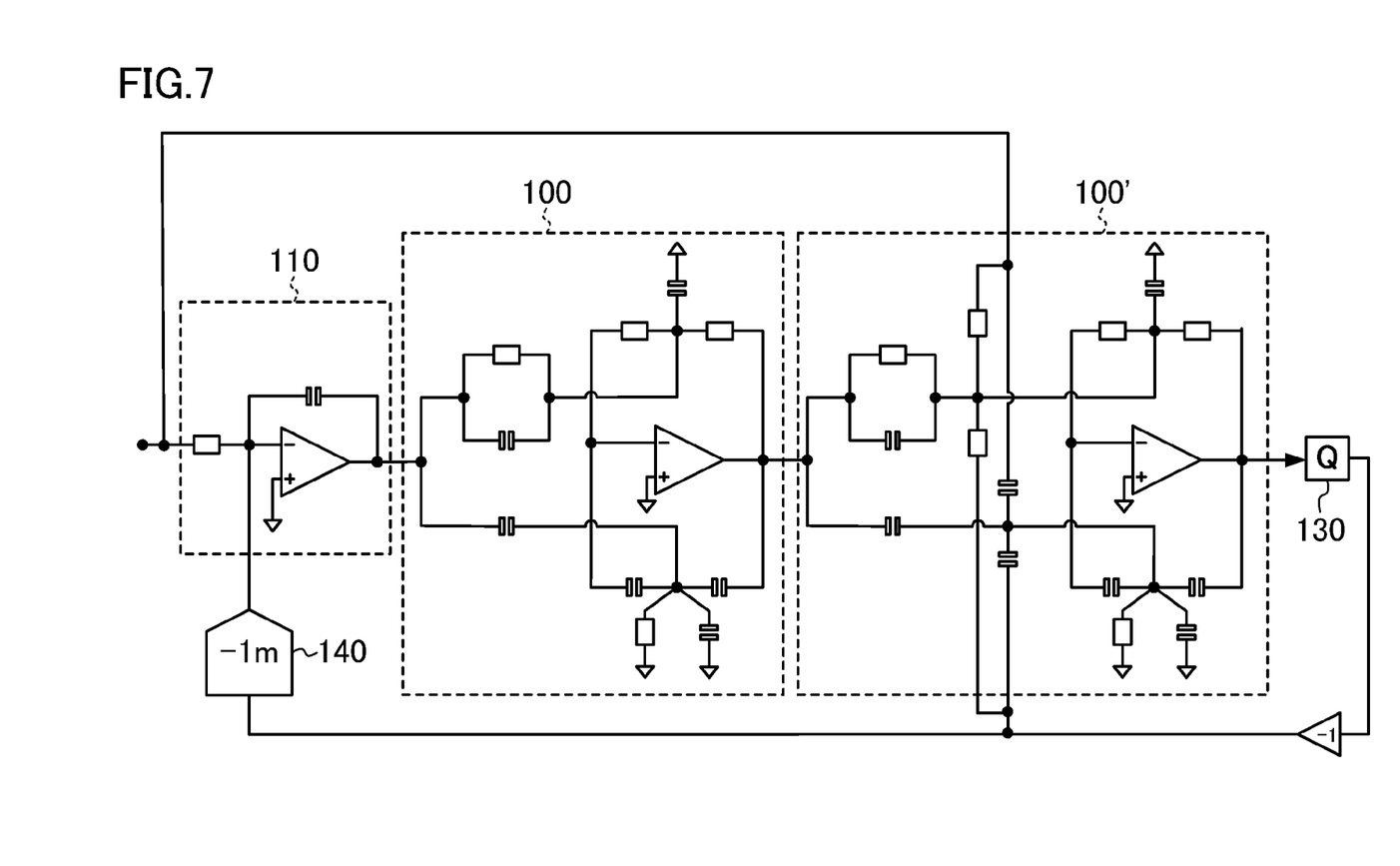
FIG. 7 is a configuration diagram of an oversampling A/D converter using the resonator of FIG. 6.

Since the resonator according to this embodiment can sum two input signals (three or more input signals in some cases), the adder 120 in the CTDS-ADC of FIG. 4 can be omitted by using the resonator according to this embodiment in a CTDS-ADC. FIG. 7 illustrates a configuration of a CTDS-ADC using the resonator according to this embodiment. The resonator 100' according to this embodiment adds an integrated output of the resonator 100 to a fed forward input signal and a fed back output of the quantizer 130, and outputs the sum to the quantizer 130. Thus, no adder is required at a stage preceding the quantizer 130, thereby reducing the circuit size and power consumption.

Fourth Embodiment

Figure 8:
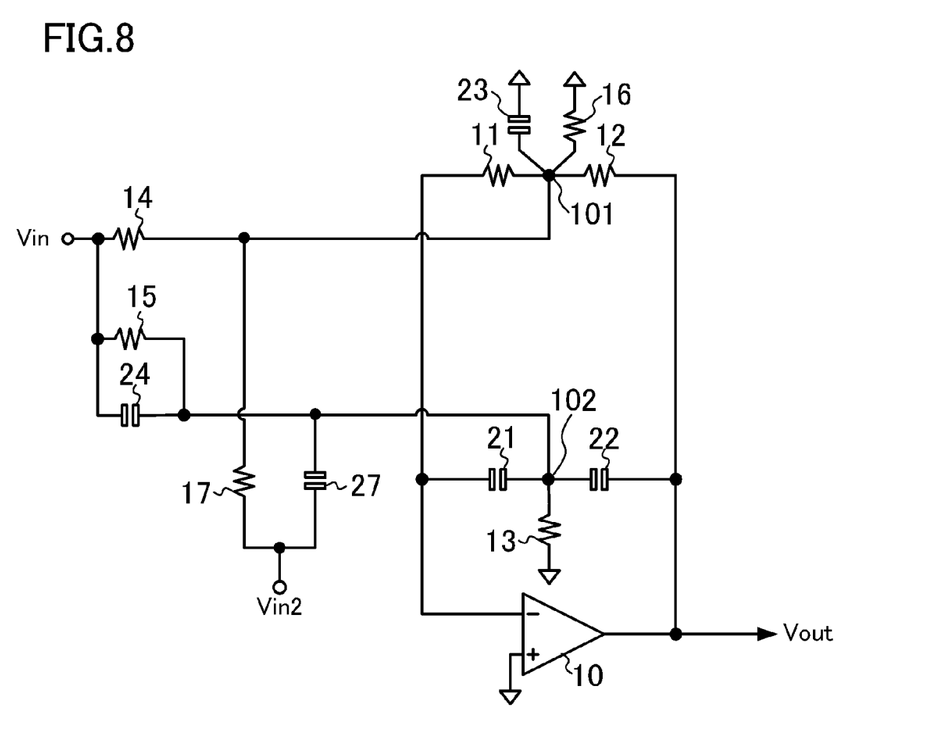
FIG. 8 is a configuration diagram of a resonator according to a fourth embodiment of the present disclosure.

FIG. 8 illustrates a configuration of a resonator according to a fourth embodiment. The resonator according to this embodiment includes a resistive element 17 and a capacitive element 27 in addition to the resonator according to the second embodiment (see FIG. 5). The resistive element 17 is coupled between the intermediate node 101 and an input terminal of a signal Vin2, and the capacitive element 27 is coupled between the intermediate node 102 and the input terminal of the signal Vin2.

In this embodiment, where a resistance value of the resistive element 17 is $R_2/\alpha$, and a capacitance value of the capacitive element 27 is $\alpha C_2$, the resonance condition is represented as follows.

$$1/R_1+(1+\alpha)/R_2+1/R_4+1/R_6=1/R_3+1/R_5, \text{ and } C_3=C_1+(1+\alpha)C_2+C_4$$

Where the resistance values of the resistive element 15 and the resistive element 16 are equal, the transfer function is represented by the following equation. It is found from the transfer function that the signal Vin and the signal Vin2 are summed $$Vout = -\frac{\frac{C_4}{C_2}s^2 + \frac{1}{R_5C_2}s + \frac{1}{R_4R_1C_2}}{s^2 + \frac{1}{R_1R_2C_1C_2}} Vin - \alpha Vin2 \qquad \text{Equation 6}$$

In order to dynamically change the transfer function while satisfying the resonance condition, the resistive element 12, the resistive element 14, the resistive element 15, the resistive element 17, and the capacitive element 24 may be the variable resistor shown in FIG. 2 or the variable capacitor shown in FIG. 3 as appropriate. Although not shown in the drawings, a CTDS-ADC similar to that in FIG. 7 can be formed with the resonator according to this embodiment.

The invention claimed is:

1. A resonator comprising:
an operational amplifier having an input terminal and an output terminal;
a first resistive element coupled between a first node and the input terminal of the operational amplifier;
a second resistive element coupled between the first node and the output terminal of the operational amplifier;
a first capacitive element coupled between a second node and the input terminal of the operational amplifier;
a second capacitive element coupled between the second node and the output terminal of the operational amplifier;
a third capacitive element coupled to the first node;
a third resistive element coupled to the second node;
a fourth resistive element coupled between the first node and a signal input terminal;
a fourth capacitive element coupled between the second node and the signal input terminal;
a fifth capacitive element coupled between the first node and the signal input terminal; and
a sixth capacitive element coupled to the second node.

2. The resonator of claim 1, wherein:
a sum of inverse numbers of resistance values of the first, second and fourth resistive elements is equal to an inverse number of a resistance value of the third resistive element, and
a sum of capacitance values of the third and fifth capacitive elements is equal to a sum of capacitance values of the first, second, fourth and sixth capacitive elements.

3. The resonator of claim 1, wherein resistance values of the second and fourth resistive elements, and capacitance values of the fourth and fifth capacitive elements are variable.

4. The resonator of claim 3, wherein:
the second and fourth resistive elements include a plurality of resistive elements coupled in parallel,
the fourth capacitive element includes a plurality of capacitive elements coupled in parallel, and
the fifth capacitive element includes a plurality of capacitive elements coupled in parallel.

5. The resonator of claim 1, further comprising:
a fifth resistive element coupled between the first node and a second signal input terminal; and
a seventh capacitive element coupled between the second node and the second signal input terminal.

6. The resonator of claim 5, wherein resistance values of the second, fourth, and fifth resistive elements, and capacitance values of the fourth and fifth capacitive elements are variable.

7. The resonator of claim 6, wherein:
the second, fourth, and fifth resistive elements include a plurality of resistive elements coupled in parallel,
the fourth capacitive element includes a plurality of capacitive elements coupled in parallel, and
the fifth capacitive element includes a plurality of capacitive elements coupled in parallel.

8. A resonator comprising:
an operational amplifier having an input terminal and an output terminal;
a first resistive element coupled between a first node and the input terminal of the operational amplifier;
a second resistive element coupled between the first node and the output terminal of the operational amplifier;
a first capacitive element coupled between a second node and the input terminal of the operational amplifier;
a second capacitive element coupled between the second node and the output terminal of the operational amplifier;
a third capacitive element coupled to the first node;
a third resistive element coupled to the second node;
a fourth resistive element coupled between the first node and a signal input terminal;
a fourth capacitive element coupled between the second node and the signal input terminal;
a fifth resistive element coupled between the second node and the signal input terminal; and
a sixth resistive element coupled to the second node.

9. The resonator of claim 8, wherein:
a sum of inverse numbers of resistance values of the first, second, fourth, and sixth resistive elements is equal to a sum of inverse numbers of resistance values of the third and fifth resistive elements, and
a capacitance value of the third capacitive element is equal to a sum of capacitance values of the first, second and fourth capacitive elements.

10. The resonator of claim 8, wherein resistance values of the second, fourth, and fifth resistive elements, and a capacitance value of the fourth capacitive element are variable.

11. The resonator of claim 10, wherein:
the second and fourth resistive elements include a plurality of resistive elements coupled in parallel,
the fifth resistive element includes a plurality of resistive elements coupled in parallel, and
the fourth capacitive element includes a plurality of capacitive elements coupled in parallel.

12. The resonator of claim 8, further comprising:
a seventh resistive element coupled between the first node and a second signal input terminal; and
a fifth capacitive element coupled between the second node and the second signal input terminal.

13. The resonator of claim 12, wherein resistance values of the second, fourth, fifth and seventh resistive elements, and a capacitance value of the fourth capacitive element are variable.

14. The resonator of claim 13, wherein:
the second, fourth, and seventh resistive elements include a plurality of resistive elements coupled in parallel,
the fifth resistive element includes a plurality of resistive elements coupled in parallel, and
the fourth capacitive element includes a plurality of capacitive elements coupled in parallel.

15. An oversampling A/D converter comprising the resonator of claim 1.

16. An oversampling A/D converter comprising the resonator of claim 8.

* * * * *